United States Patent
Koch et al.

(10) Patent No.: US 10,804,889 B2
(45) Date of Patent: *Oct. 13, 2020

(54) DOUBLE COMPRESSION AVOIDANCE

(71) Applicant: International Business Machines Corporation, Armonk, NY (US)

(72) Inventors: Michael V. Koch, Ehningen (DE); Andreas H. A. Arp, Nufringen (DE); Matthias Ringe, Tuebingen (DE); Fatih Cilek, Boeblingen (DE)

(73) Assignee: International Business Machines Corporation, Armonk, NY (US)

(*) Notice: Subject to any disclaimer, the term of this patent is extended or adjusted under 35 U.S.C. 154(b) by 2 days.

This patent is subject to a terminal disclaimer.

(21) Appl. No.: 15/807,634

(22) Filed: Nov. 9, 2017

(65) Prior Publication Data
US 2019/0020334 A1    Jan. 17, 2019

Related U.S. Application Data

(63) Continuation of application No. 15/649,771, filed on Jul. 14, 2017, now Pat. No. 10,298,217.

(51) Int. Cl.
*H03K 5/151*    (2006.01)
*H03K 3/038*    (2006.01)
(Continued)

(52) U.S. Cl.
CPC ............ *H03K 5/1515* (2013.01); *G06F 1/10* (2013.01); *H03K 3/038* (2013.01); *H03K 5/135* (2013.01);
(Continued)

(58) Field of Classification Search
CPC .................................................... H03K 5/1515
See application file for complete search history.

(56) References Cited

U.S. PATENT DOCUMENTS

| 5,268,656 A | 12/1993 | Muscavage |
| 5,465,347 A | 11/1995 | Chao |

(Continued)

OTHER PUBLICATIONS

IBM, Appendix P, List of patents or patent applications treated as related, filed herewith, 2 pages.
(Continued)

*Primary Examiner* — Lincoln D Donovan
*Assistant Examiner* — Colleen J O Toole
(74) *Attorney, Agent, or Firm* — Monchai Chuaychoo; Gilbert Harmon, Jr.

(57) ABSTRACT

The disclosure relates to a skew control circuit for controlling the skew between at least three clock signals, the clock signals being forwarded to different clock domains associated with the respective clock signals. The skew control circuit comprises multiple programmable delay elements arranged within a signal flow before the respective clock domain, a skew detector arrangement operable for detecting skews between at least two pairs of the clock signals, and a control circuit operable for adjusting delays caused by the programmable delay elements. The control circuit is operable for carrying out a de-skewing operation. The de-skewing operation comprises determining an order of occurrence of edges of the signals, selecting one of the programmable delay elements based on the determined order, and adjusting the delay caused by the selected programmable delay element.

7 Claims, 9 Drawing Sheets

(51) Int. Cl.
  G06F 1/10 (2006.01)
  H03K 5/135 (2006.01)
  H03K 3/037 (2006.01)
  H03K 5/00 (2006.01)

(52) U.S. Cl.
  CPC ... *H03K 3/037* (2013.01); *H03K 2005/00058* (2013.01)

(56) References Cited

U.S. PATENT DOCUMENTS

| | | | |
|---|---|---|---|
| 6,150,865 A | 11/2000 | Fluxman | |
| 6,583,649 B2 * | 6/2003 | Nakamura | H04L 25/085 |
| | | | 326/101 |
| 7,251,765 B2 | 7/2007 | Kushiyama | |
| 7,770,049 B1 | 8/2010 | Searles | |
| 7,971,088 B2 | 6/2011 | Jung | |
| 8,031,823 B2 | 10/2011 | Jenkins et al. | |
| 8,205,182 B1 * | 6/2012 | Zlatanovici | G06F 30/327 |
| | | | 716/125 |
| 8,817,936 B2 | 8/2014 | Dominguez | |
| 9,356,589 B2 | 5/2016 | Ebuchi et al. | |
| 10,348,279 B2 | 7/2019 | Arp | |
| 10,564,664 B2 | 2/2020 | Arp | |
| 2003/0197537 A1 | 10/2003 | Saint-Laurent | |
| 2008/0150605 A1 | 6/2008 | Chueh et al. | |
| 2013/0336082 A1 | 12/2013 | Khawshe | |
| 2014/0306746 A1 | 10/2014 | Meneghini | |
| 2015/0323958 A1 | 11/2015 | Arabi | |

OTHER PUBLICATIONS

Kumar et al., "A New Method to Minimize the Clock Skew to Enhance Performance of Digital System", International Journal of Engineering Science and Technology vol. 2(6), 2010, 2479-2482.
Sasaki et al., "A Circuit for On-chip Skew Adjustment with Jitter and Setup Time Measurement", IEEE Asian Solid-State Circuits Conference Nov. 8-10, 2010 / Beijing, China, 4 pages.

* cited by examiner

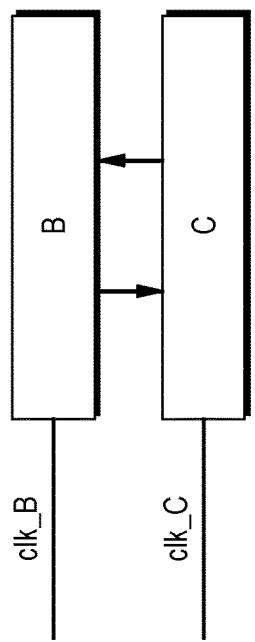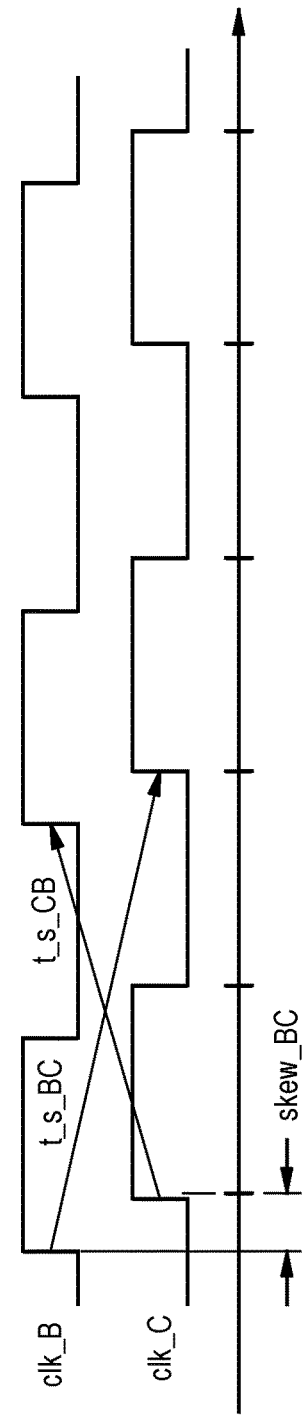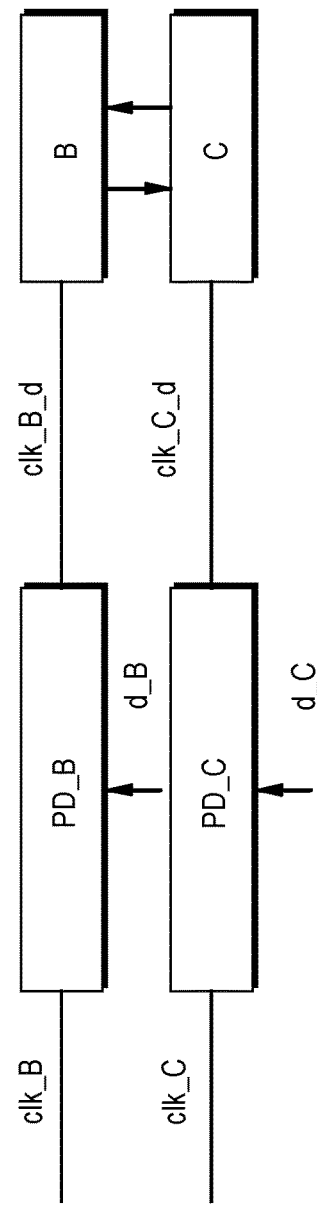

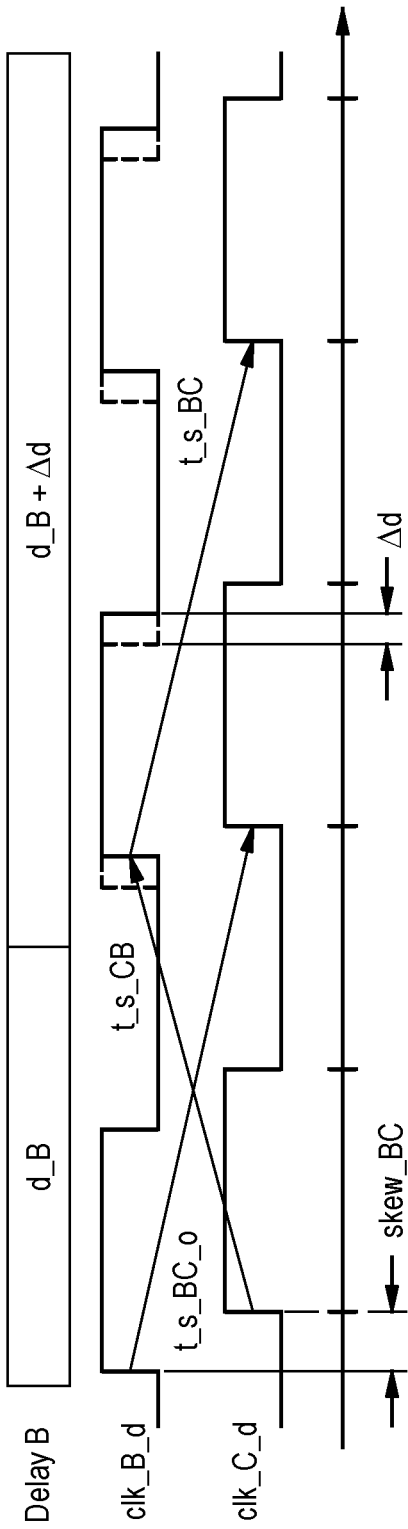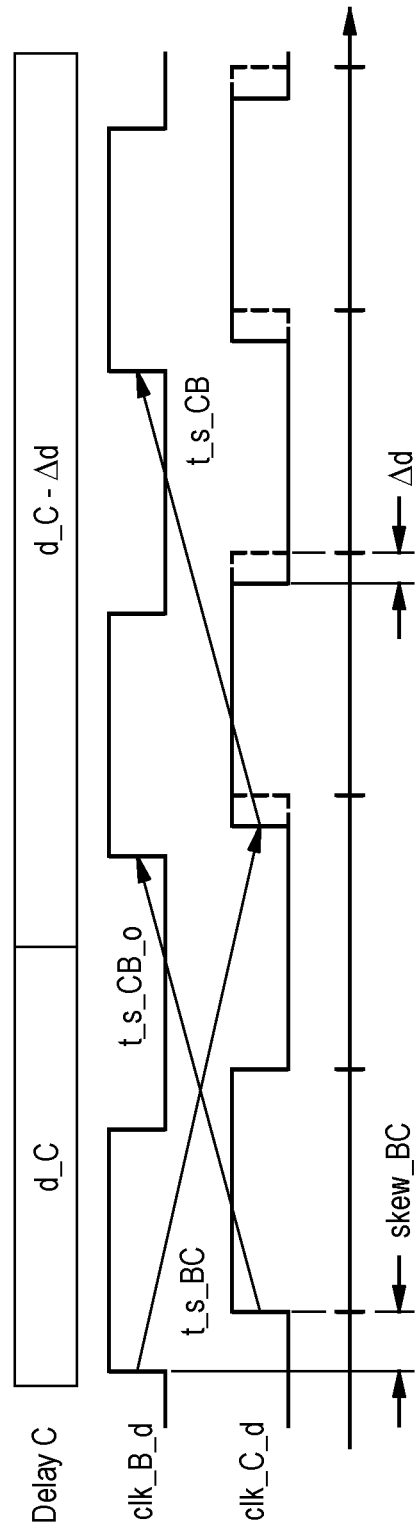
FIG. 4a
FIG. 4b

//DOUBLE COMPRESSION AVOIDANCE

BACKGROUND OF THE INVENTION

The present invention relates generally to skew control circuit and more specifically, for controlling the skew between at least three clock signals.

A logic device may comprise several sub-circuits each having an associated clock domain. The clock domains of two sub-circuits exchanging data have to be in synchronization to avoid data loss and/or data faults. The sub-circuits may be configured to communicate in a hierarchical structure, wherein each sub-circuit communicates with one or more daughter sub-circuits and one mother sub-circuit (except for the root sub-circuit). For example, a microprocessor may comprise four processor cores, wherein two of the four processor cores may exchange data via a first second level cache and the other two of the four processor cores may exchange data via a second level cache. To allow for a data exchange between the two branches, a third level cache is provided, which communicates with the first second level cache and the second level cache. Thus, the first second level cache has two daughter sub-circuits, namely, two of the four processor cores, and one mother sub-circuit, namely, the third level cache. The seven sub-circuits (one third level cache, two second level caches, and four processor cores) each have an associated clock domain. The clock domains are (directly or indirectly) driven by a common global clock source. However, the local clock signal of one clock domain of one sub-circuit may be early with respect to another clock-domain of a sub-circuit communicating with the aforementioned sub-circuit. The difference may also be called "skew". Delay lines may be provided between the global clock source and the local clock sources of said clock domains to ensure proper data exchange between the sub-circuits. Additional timing restrictions may have to be observed using known skew adjusting circuits and methods to allow for parallel skew adjusting and data transmissions.

SUMMARY

According to an embodiment, a method for operating a control circuit of a skew control circuit for controlling the skew between at least three clock signals, the method comprising: determining an order of occurrence of edges of the clock signals; selecting one of the programmable delay elements based on the determined order; and adjusting the delay caused by the selected programmable delay element.

BRIEF DESCRIPTION OF THE DRAWINGS

FIG. 1 shows an exemplary clock domains in accordance with an embodiment of the present invention;

FIG. 2 shows an exemplary timing diagrams in accordance with an embodiment of the present invention;

FIG. 3 shows another exemplary clock domains in accordance with an embodiment of the present invention;

FIG. 4a shows an exemplary timing diagram in accordance with an embodiment of the present invention;

FIG. 4b shows an exemplary timing diagram in accordance with an embodiment of the present invention;

DETAILED DESCRIPTION

Figure 5:
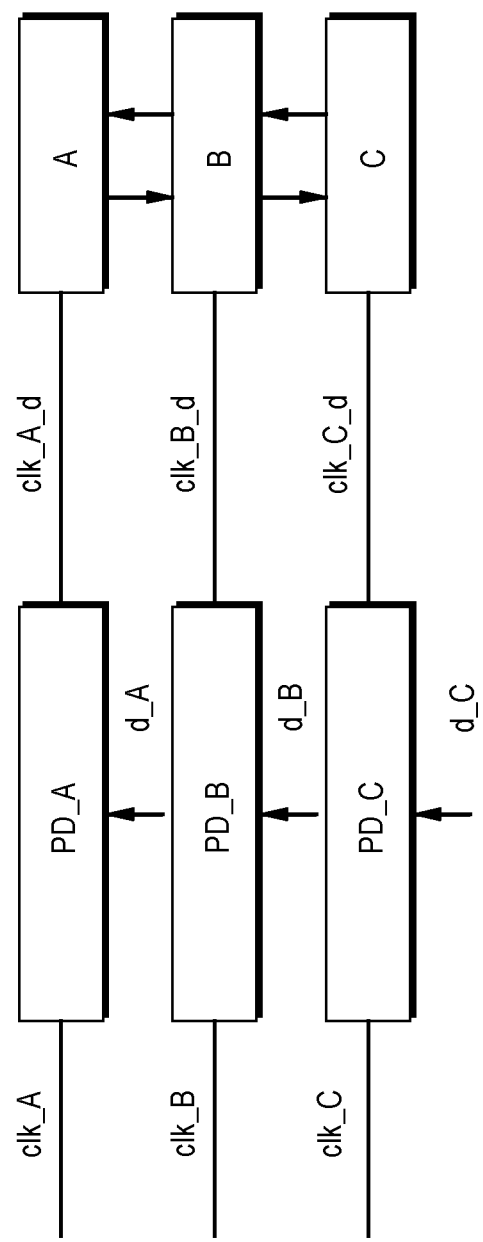
FIG. 5 shows an exemplary clock domains in accordance with an embodiment of the present invention.

The embodiments depicted and described herein recognize the challenges of controlling a skew between at least three clock signals. The improvement lies in the ability to avoid shortening the delay for both clocks at the same time, but decrease the delay of the later clock first and then decrease the delay of the earlier clock.

Implementation of embodiments of the invention can take a variety of forms, and exemplary implementation details are discussed subsequently with reference to the Figures.

FIG. 1 shows an exemplary semiconductor circuit with two sub-circuits belonging two clock domains B and C, respectively. The clock domain B receives a clock signal clk_B and the clock domain C receives a clock signal clk_C. A sub-circuit belonging to a certain clock domain, for example, the clock domain B, may have to exchange data with a sub-circuit belonging to a different clock domain, for example, the clock domain C. This is indicated with the arrows in FIG. 1. Typically, the edges of the clock signals clk_B and clk_C do not arrive at the respective clock domains B and C at same time but with a difference in time which is also called skew. Accordingly, the edges do not arrive at the same time at the data launching flip flop of the transmitting sub-circuit and the data capturing flip flop of the receiving sub-circuit. This difference in arrival times decreases (or increases) the time available to transmit data (launch and capture) between two sub-circuits. The time available to transmit data between two sub-circuits may be called setup time.

FIG. 2 shows an exemplary timing diagrams for a clock signal clk_B and a clock signal clk_C. In the example, the clock signal clock_C is delayed with respect to the clock signal clk_B by a skew |skew_BC|. As may be seen from the timing diagrams the setup time for transferring data from a sub-circuit belonging to clock domain B to a sub-circuit belonging to clock domain C T_s_BC is increased to amount to t_s_BC=t_cycle+|skew_BC|, wherein t_cycle is the cycle time of the clocks. On the other hand, the setup time for transferring data from a sub-circuit belonging to clock domain C to a sub-circuit belonging to clock domain B t_s_CB is decreased to t_s_CB=t_cycle−|skew_BC|.

It has become more and more common to provide means for actively reducing the skew between different clock domains in modern semiconductor circuits. Programmable delay elements may be used for this purpose. For example, as shown in FIG. 3, the clock signals clk_B and clk_C of FIG. 1 may be delayed by programmable delay elements PD_B and PD_C, respectively. The programmable delay elements PD_B and PD_C may, in response to respective control signals d_B and d_C, delay the clock signals clk_B and clk_C, preferably in equally sized steps. Thus, the programmable delay elements PD_B and PD_C may delay the respective clock signals clk_B and clk_C by integer multiples of a delay step size Δd, wherein Δd is greater than zero. For example, the delay step size Δd may amount to 3 ps. Using said programmable delays, the skew |skew_BC| may be reduced and limited to the delay step size Δd. Accordingly, the minimum setup time for transferring data from a sub-circuit belonging to clock domain C to a sub-circuit belonging to clock domain B t_s_CB_min may be t_s_CB_min=t_cycle−Δd. The design of semiconductor circuits (operating frequency, line width, etc.) has to be adapted such that no data loss occurs when the setup time is as short as the minimum setup time.

Adjusting the delays of the programmable delay elements may have an additional influence on the setup times. Minimizing the skew between the clock domains B and C shown in FIG. 3 can be accomplished by either delaying the earlier clock signal, i.e., increasing the delay induced by the programmable delay element associated with the earlier clock signal, or accelerating the later clock, i.e., decreasing the delay induced by the programmable delay element associated with the later clock signal.

FIG. 4a shows an exemplary timing diagram for the case that the delay induced by the programmable delay element associated with the earlier clock signal is increased. In the example, the clock signal clk_B_d rises before the clock signal clk_C_d for given delays d_B and d_C induced by the programmable delay elements PD_B and PD_C. The time difference amounts to |skew_BC|. Afterwards, the delay induced by the programmable delay element PD_B is increased by an amount Δd. Accordingly, the clock signal clk_B_d no longer follows the dashed line, but the continuous line and the skew between the clock signal clk_B and clk_C is reduced to |skew_BC|−Δd.

The setup time t_s_BC for transmitting data from clock domain B to clock domain C is reduced from t_s_BC_o=t_cycle+|skew_BC| to t_s_BC=t_cycle+|skew_BC|−Δd. Correspondingly, the setup time for transmitting data from clock domain to C to clock domain B is increased from t_s_CB_o (not shown)=t_cycle−|skew_BC| to t_s_CB=t_cycle−|skew_BC|+Δd.

FIG. 4b shows an exemplary timing diagram for the case that the delay induced by the programmable delay element associated with the later clock signal is decreased. From the example shown in FIG. 4a, the clock signal clk_B_d rises before the clock signal clk_C_d for given delays d_B and d_C induced by the programmable delay elements PD_B and PD_C and the time difference amounts to |skew_BC|. Thereafter, the delay induced by the programmable delay element PD_C is decreased by an amount Δd. Hence, the clock signal clk_C no longer follows the dashed line, but the continuous line and the skew between the clock signal clk_B_d and clk_C_d is reduced to |skew_BC|−Δd.

The setup time t_s_BC for transmitting data from clock domain B to clock domain C is reduced from t_s_BC_old (not shown)=t_cycle+skew_BC to t_s_BC=t_cycle+skew_BC−Δd. Accordingly, the setup time for transmitting data from clock domain to C to clock domain B is increased from t_s_CB_o=t_cycle−skew_BC to t_s_CB=t_cycle−skew_BC+Δd.

Performing skew reduction by decreasing delays induced by programmable delay elements instead of increasing the delays may be preferred to avoid increasing an overall delay and to reduce jitter.

Modern integrated semiconductor circuits may comprise more than two clock domains. For example, FIG. 5 shows a semiconductor circuit including three clock domains A, B and C. Each clock domain A, B and C receives a delayed clock signal clk_A_d, clk_B_d, clk_C_d. Programmable delay elements PD_A, PD_B and PD_C receive clock signals clk_A, clk_B and clk_C, delay said signals d_A, d_B and d_C and transmit the delayed clock signals clk_A_d, clk_B_d and clk_C_d. The clock domains A and B exchange data and the clock domains B and C exchange data as indicated with corresponding arrows in FIG. 5.

Figure 6A:
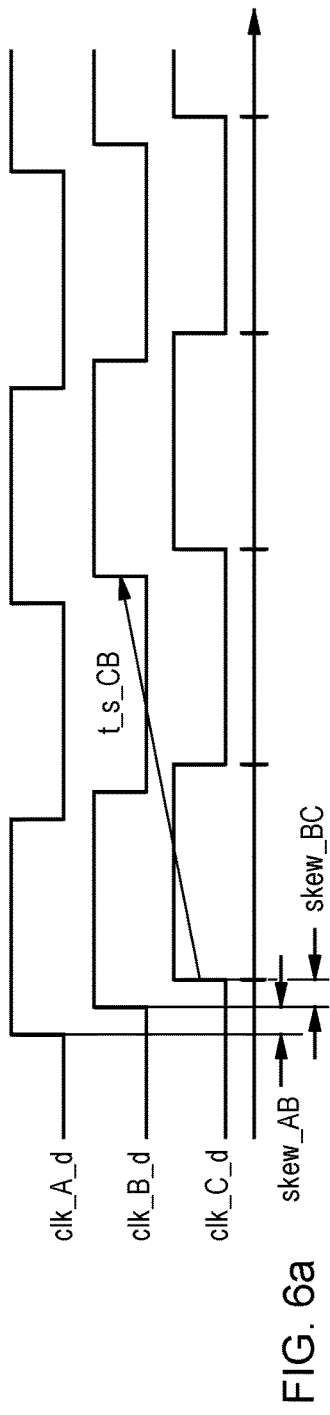
FIG. 6a shows an exemplary timing diagram in accordance with an embodiment of the present invention.

In a system comprising more than two clock domains, sometimes two or more clock signals have to be adjusted at the same time to minimize the skew. FIG. 6a shows three clock signals clk_A_d, clk_B_d and clk_C_d. The rising edge of the clock signal clk_A_d arrives before the rising edge of the clock signal clk_B_d and the rising edge of the clock signal clk_B_d arrives before the rising edge of the clock signal clk_C_d. The respective time differences may be called skew_AB and skew_BC.

Figure 6B:
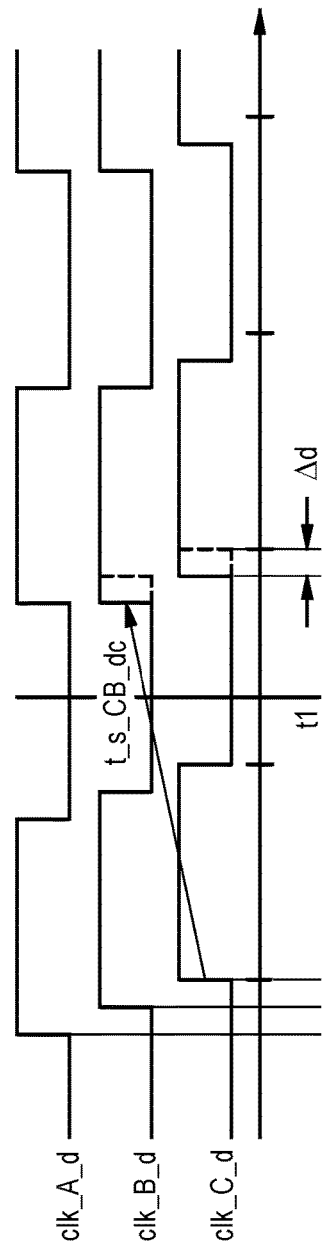
FIG. 6b shows an exemplary timing diagram in accordance with an embodiment of the present invention.

As shown in FIG. 6b, the delay for both clock signals clk_A_d and clk_B_d may be reduced at the same time. This may induce a very short setup time for transferring data from clock domain C to clock domain B during transition. On the one hand, setup time for transferring data from the clock domain C to clock domain B is already shorter then t_cycle due to the skew between clock domain B and C. This already short setup time is further reduced due to the earlier rising edge of the clock signal clk_B_d caused by the decreased delay induced by the programmable delay element PD_B.

Accordingly, the minimal setup time for transmitting data from clock domain C to clock domain B may be calculated to be t_s_CB_min=t_cycle−2·Δd. This reduction by two times the delay step Δd may also be called double cycle compression. Double cycle compression does not occur when delays are incremented.

Figure 6C:
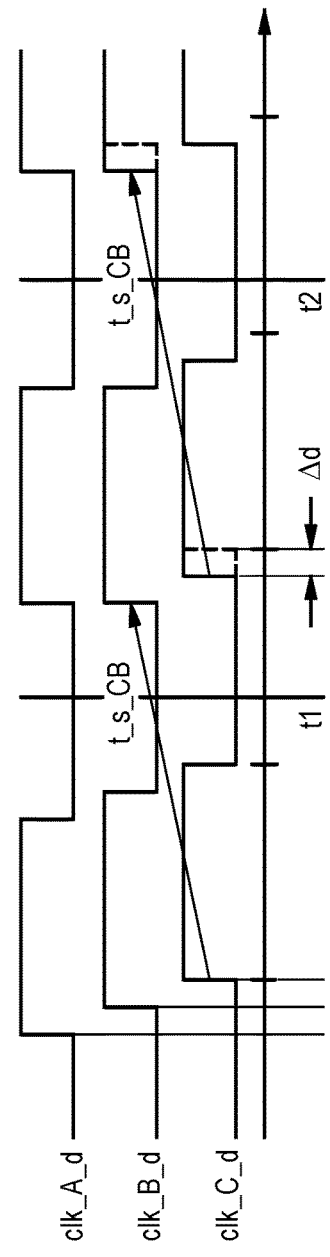
FIG. 6c shows an exemplary timing diagram in accordance with an embodiment of the present invention.

FIG. 6c illustrates the avoidance of decreasing the delays of two programmable delay lines at the same time. Instead, the order of occurrence of the rising edges (or falling edges) of the clock signals clk_A_d, clk_B_d and clk_C_d is determined. Based on the determined order, a programmable delay element of the programmable delay elements PD_A, PD_B and PD_C is selected and the delay caused by the selected programmable delay element is adjusted.

The delay of another programmable delay element may be adjusted at least one clock cycle later. The selected programmable delay element may be the programmable delay element associated with the clock signal with the highest latency, i.e. the clock signal with the latest arrival time. The clock signal with the highest latency may be the clock signal with the last rising edge or last falling edge within a clock cycle. Thus, ordering may be done in a descending order of clock latencies. It may be started with the latest clock signal down to the earliest clock signal of the clock signals to be sped up.

In the example shown in FIGS. 6a to 6c, the slowest clock signal is the clock signal clk_C_d. Thus, in a first step, the programmable delay element PD_C is adjusted. It is only in the next clock cycle that the programmable delay element PD_B of the second latest clock signal clk_B_d is adjusted. This approach may avoid the double cycle compression explained above, in particular, t_s_CB may not be influenced by the skew reduction as shown in FIG. 6c. The gain of setup time may be used to relax timing requirements on logic paths, to reduce the development time and effort and/or to increase the clock frequency of the semiconductor circuit under consideration.

Figure 7:
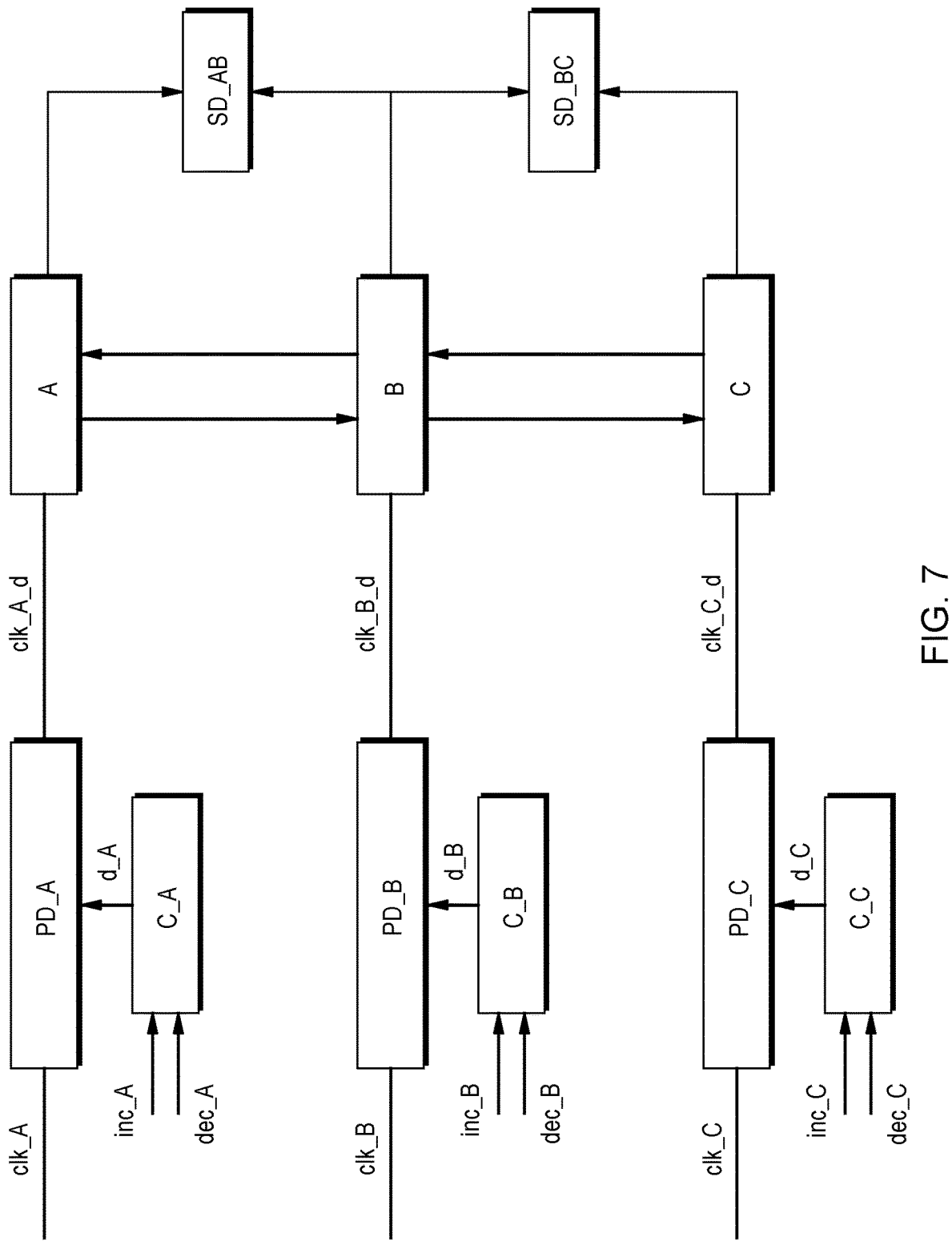
FIG. 7 shows exemplary clock domains in accordance with an embodiment of the present invention.

FIG. 7 illustrates a further semiconductor circuit comprising a clock domains A, B, C. Each clock domain A, B and C receives a respective delayed clock signal clk_A_d, clk_B_d, clk_C_d. Programmable delay elements PD_A, PD_B and PD_C receive clock signals clk_A, clk_B and clk_C, delay signals d_A, d_B and d_C and transmit the delayed clock signals clk_A_d, clk_B_d and clk_C_d. The clock domains A and B exchange data and the clock domains B and C exchange data as indicated with corresponding arrows in FIG. 7.

According to the example shown in FIG. 7, the delay signals may be generated by counters C_A, C_B and C_C. The counters C_A, C_B and C_C can be incremented or decremented deliberately. Skew detectors SD_AB and SD_BC may be used to determine the skew between clock domains A and B as well as between clock domains B and C, respectively.

Based on the determined skew, a known skew reduction algorithm may be used to generate increment signals Inc_A, Inc_B, Inc_C or decrement signals Dec_A, Dec_B, Dec_C to be transmitted to the counters for adjusting the delays d_A, d_B and d_C, respectively. For example, a skew reduction algorithm is described in U.S. patent application Ser. No. 15/593,057 or U.S. Ser. No. 15/593,079 both filed on May 11, 2017, the content thereof being incorporated by reference.

The following table shows the possible combination of decrement signals:

| Dec_A | Dec_B | Dec_C |
|-------|-------|-------|
| 0 | 0 | 1 |
| 0 | 1 | 0 |
| 0 | 1 | 1 |
| 1 | 0 | 0 |
| 1 | 0 | 1 |
| 1 | 1 | 0 |

Only in two cases more than one delay has to be decremented. Thus, only in two cases double-compression may occur.

Figure 8:
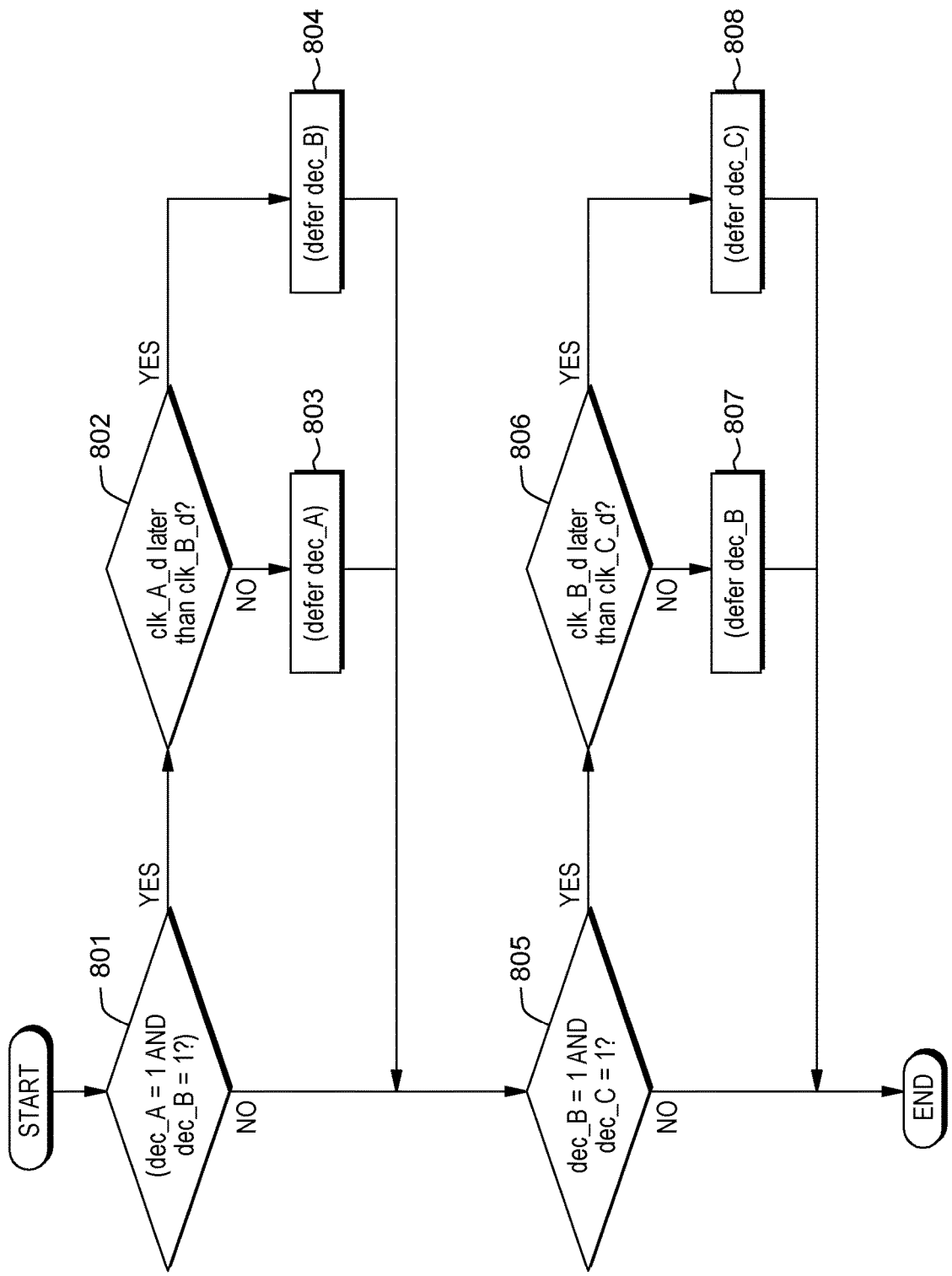
FIG. 8 shows an exemplary flowchart in accordance with an embodiment of the present invention.

FIG. 8 shows a flow diagram for determining which delay is reduced first. In the first step 801, it is determined if the skew reduction algorithm prescribes decreasing d_A and d_B, i.e. if the decrement signals dec_A and dec_B are both 1. If this is the case, it is determined if the rising (falling) edge of clock signal clk_A_d arrives later than the rising (falling) edge of clock signal clk_B_d (step 802). If this is the case, decreasing the delay of the programmable delay element PD_B is deferred to a later clock cycle (step 803). If not, decreasing the delay of the programmable delay element PD_A is deferred to a later clock cycle (step 804).

Afterwards or if the query 801 resulted in a negative answer, it is determined if the skew reduction algorithm prescribes decreasing d_B and d_C, i.e. if the decrement signals dec_B and dec_C are both 1 (step 805). If this is the case, it is determined if the rising (falling) edge of clock signal clk_B_d arrives later than the rising (falling) edge of clock signal clk_C_d (step 806). If this is the case, decreasing the delay of the programmable delay element PD_C is deferred to a later clock cycle (step 807). If not, decreasing the delay of the programmable delay element PD_B is deferred to a later clock cycle (step 808).

Figure 9:
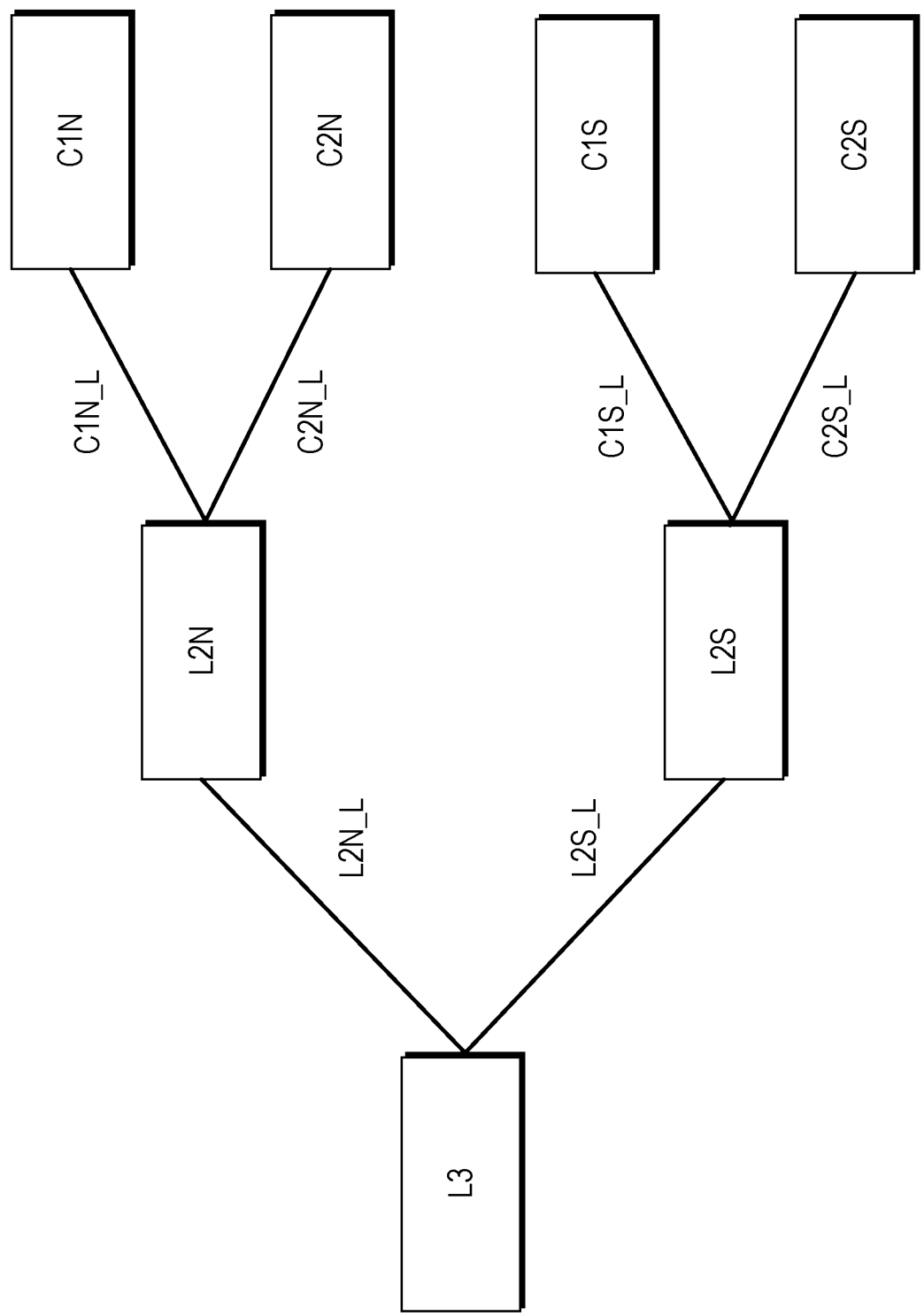
FIG. 9 shows an exemplary clock domains in accordance with an embodiment of the present invention.

FIG. 9 shows a further semiconductor circuit comprising six clock domains L3, L2N, L2S, C1N, C2N, C1S, C2S. Data is exchanged between two clock domains connected by a continues line. Moreover, the semiconductor circuit shown in FIG. 9 comprises skew detectors (not shown) transmitting signals *–L indicating if the clock domain on the right-hand side is late compared to the clock domain on the left-hand side of the connecting line. For example, it is provided a skew detector transmitting a signal L2N_L indicating whether the clock domain L2N is late with respect to the clock domain L3. In particular, if the signal L2N_L is 1 the clock domain L2N is late with respect to the clock domain L3.

Figure 10:
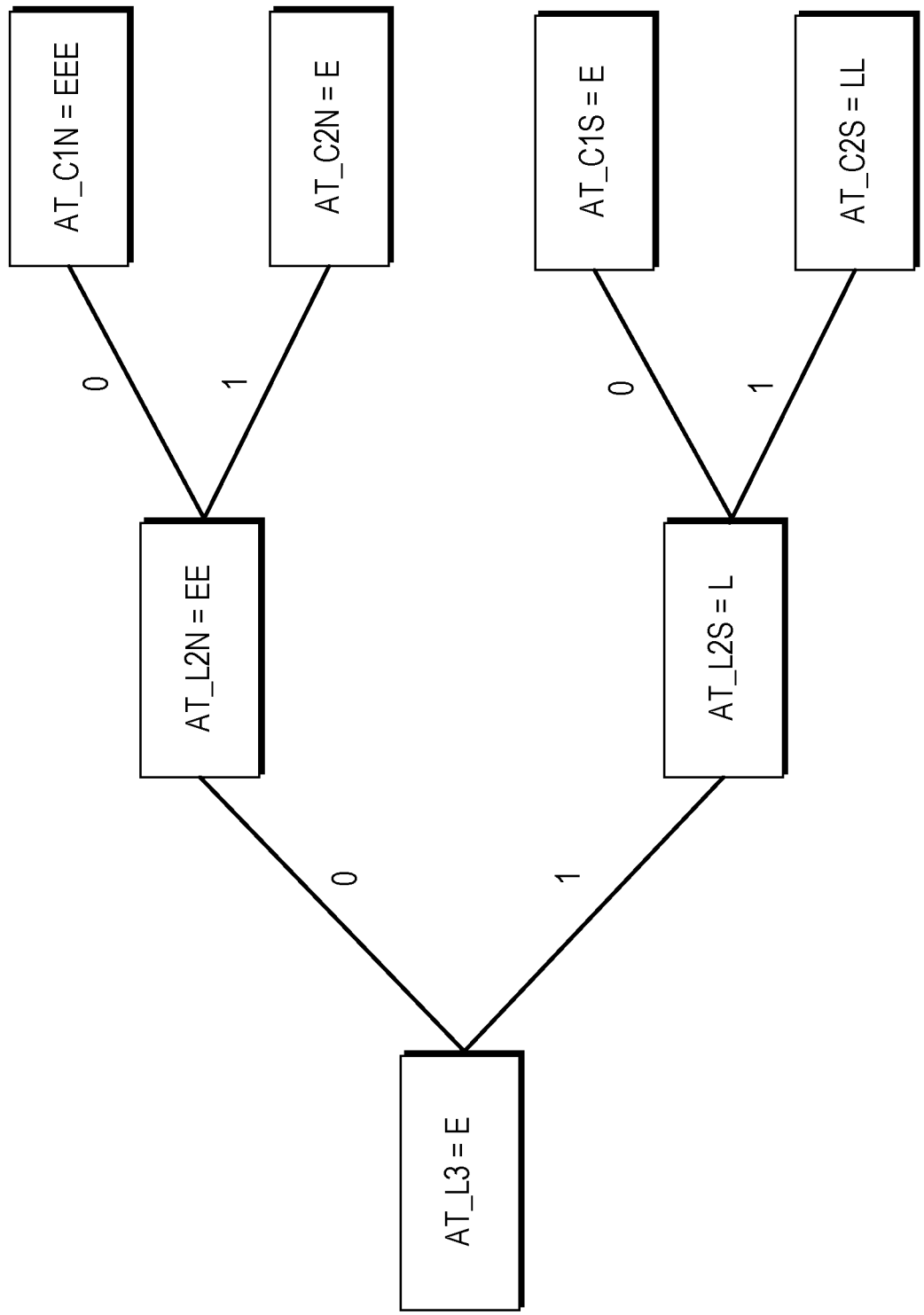
FIG. 10 shows an exemplary clock domains in accordance with an embodiment of the present invention.

The signals transmitted by the different skew detectors may be used to determine the order of the rising (falling) edges of the clock signals. FIG. 10 shows exemplary skew detector values and relative arrival times (AT_*). An early arrival time is marked with an E and a late arrival time with an L. Even earlier arrival times are marked with additional Es (EE, EEE, etc.) and even later arrival times with additional Ls (LL, LLL, etc.). In a first step, the arrival time for the clock domain L3 is determined. If, as shown, at least one of L2N_L and L2S_L is 1, i.e., the clock domain L3 is marked with E. As L2N_L=0, the clock domain L2N is early with respect to L3 and the clock domain L2N is marked EE. As C1N_L=0, the clock domain C1N is early with respect to clock domain L2N and is marked EEE. As C2N_L=1. The clock domain C2N is late with respect to clock domain L2N and is marked with only one E. The same is done for all the other clock domains and for all possible combinations of skew detector signals resulting in the following table.

| L2N_L? | L2S_L? | C1N_L? | C2N_L? | C1S_L? | C2S_L? | AT_L3 | AT_L2N | AT_L2S | AT_C1N | AT_C2N | AT_C1S | AT_C2S | t_L3 | t_L2N | t_L2S | t_C1N | t_C2N | t_C1S | t_C2S |
|---|---|---|---|---|---|---|---|---|---|---|---|---|---|---|---|---|---|---|---|
| 0 | 0 | 0 | 0 | 0 | 0 | L | E | E | E | E | E | E | 0 | 1 | 1 | 2 | 2 | 2 | 2 |
| 0 | 0 | 0 | 0 | 0 | 1 | L | E | E | E | E | E | L | 0 | 1 | 1 | 2 | 2 | 2 | 0 |
| 0 | 0 | 0 | 0 | 1 | 0 | L | E | E | E | E | L | E | 0 | 1 | 1 | 2 | 2 | 0 | 2 |
| 0 | 0 | 0 | 0 | 1 | 1 | L | E | E | E | E | L | L | 0 | 1 | 1 | 2 | 2 | 0 | 0 |
| 0 | 0 | 0 | 1 | 0 | 0 | L | E | E | E | L | E | E | 0 | 1 | 1 | 2 | 0 | 2 | 2 |
| 0 | 0 | 0 | 1 | 0 | 1 | L | E | E | E | L | E | L | 0 | 1 | 1 | 2 | 0 | 2 | 0 |
| 0 | 0 | 0 | 1 | 1 | 0 | L | E | E | E | L | L | E | 0 | 1 | 1 | 2 | 0 | 0 | 2 |
| 0 | 0 | 0 | 1 | 1 | 1 | L | E | E | E | L | L | L | 0 | 1 | 1 | 2 | 0 | 0 | 0 |
| 0 | 0 | 1 | 0 | 0 | 0 | L | E | E | L | E | E | E | 0 | 1 | 1 | 0 | 2 | 2 | 2 |
| 0 | 0 | 1 | 0 | 0 | 1 | L | E | E | L | E | E | L | 0 | 1 | 1 | 0 | 2 | 2 | 0 |
| 0 | 0 | 1 | 0 | 1 | 0 | L | E | E | L | E | L | E | 0 | 1 | 1 | 0 | 2 | 0 | 2 |
| 0 | 0 | 1 | 0 | 1 | 1 | L | E | E | L | E | L | L | 0 | 1 | 1 | 0 | 2 | 0 | 0 |
| 0 | 0 | 1 | 1 | 0 | 0 | L | E | E | L | L | E | E | 0 | 1 | 1 | 0 | 0 | 2 | 2 |
| 0 | 0 | 1 | 1 | 0 | 1 | L | E | E | L | L | E | L | 0 | 1 | 1 | 0 | 0 | 2 | 0 |
| 0 | 0 | 1 | 1 | 1 | 0 | L | E | E | L | L | L | E | 0 | 1 | 1 | 0 | 0 | 0 | 2 |
| 0 | 0 | 1 | 1 | 1 | 1 | L | E | E | L | L | L | L | 0 | 1 | 1 | 0 | 0 | 0 | 0 |
| 0 | 1 | 0 | 0 | 0 | 0 | E | E | L | E | E | E | E | 1 | 2 | 0 | 3 | 3 | 2 | 2 |
| 0 | 1 | 0 | 0 | 0 | 1 | E | E | L | E | E | E | L | 1 | 2 | 0 | 3 | 3 | 2 | 1 |
| 0 | 1 | 0 | 0 | 1 | 0 | E | E | L | E | E | L | E | 1 | 2 | 0 | 3 | 3 | 1 | 2 |
| 0 | 1 | 0 | 0 | 1 | 1 | E | E | L | E | E | L | L | 1 | 2 | 0 | 3 | 3 | 1 | 1 |
| 0 | 1 | 0 | 1 | 0 | 0 | E | E | L | E | L | E | E | 1 | 2 | 0 | 3 | 1 | 2 | 2 |
| 0 | 1 | 0 | 1 | 0 | 1 | E | E | L | E | L | E | L | 1 | 2 | 0 | 3 | 1 | 2 | 1 |
| 0 | 1 | 0 | 1 | 1 | 0 | E | E | L | E | L | L | E | 1 | 2 | 0 | 3 | 1 | 1 | 2 |
| 0 | 1 | 0 | 1 | 1 | 1 | E | E | L | E | L | L | L | 1 | 2 | 0 | 3 | 1 | 1 | 1 |
| 0 | 1 | 1 | 0 | 0 | 0 | E | E | L | L | E | E | E | 1 | 2 | 0 | 1 | 3 | 2 | 2 |
| 0 | 1 | 1 | 0 | 0 | 1 | E | E | L | L | E | E | L | 1 | 2 | 0 | 1 | 3 | 2 | 1 |
| 0 | 1 | 1 | 0 | 1 | 0 | E | E | L | L | E | L | E | 1 | 2 | 0 | 1 | 3 | 1 | 2 |
| 0 | 1 | 1 | 0 | 1 | 1 | E | E | L | L | E | L | L | 1 | 2 | 0 | 1 | 3 | 1 | 1 |
| 0 | 1 | 1 | 1 | 0 | 0 | E | E | L | L | L | E | E | 1 | 2 | 0 | 1 | 1 | 2 | 2 |
| 0 | 1 | 1 | 1 | 0 | 1 | E | E | L | L | L | E | L | 1 | 2 | 0 | 1 | 1 | 2 | 1 |
| 0 | 1 | 1 | 1 | 1 | 0 | E | E | L | L | L | L | E | 1 | 2 | 0 | 1 | 1 | 1 | 2 |
| 0 | 1 | 1 | 1 | 1 | 1 | E | E | L | L | L | L | L | 1 | 2 | 0 | 1 | 1 | 1 | 1 |
| 1 | 0 | 0 | 0 | 0 | 0 | E | L | E | E | E | E | E | 1 | 0 | 2 | 2 | 2 | 3 | 3 |
| 1 | 0 | 0 | 0 | 0 | 1 | E | L | E | E | E | E | L | 1 | 0 | 2 | 2 | 2 | 3 | 1 |
| 1 | 0 | 0 | 0 | 1 | 0 | E | L | E | E | E | L | E | 1 | 0 | 2 | 2 | 2 | 1 | 3 |
| 1 | 0 | 0 | 0 | 1 | 1 | E | L | E | E | E | L | L | 1 | 0 | 2 | 2 | 2 | 1 | 1 |
| 1 | 0 | 0 | 1 | 0 | 0 | E | L | E | E | L | E | E | 1 | 0 | 2 | 2 | 0 | 3 | 3 |
| 1 | 0 | 0 | 1 | 0 | 1 | E | L | E | E | L | E | L | 1 | 0 | 2 | 2 | 0 | 3 | 1 |
| 1 | 0 | 0 | 1 | 1 | 0 | E | L | E | E | L | L | E | 1 | 0 | 2 | 2 | 0 | 1 | 3 |
| 1 | 0 | 0 | 1 | 1 | 1 | E | L | E | E | L | L | L | 1 | 0 | 2 | 2 | 0 | 1 | 1 |
| 1 | 0 | 1 | 0 | 0 | 0 | E | L | E | L | E | E | E | 1 | 0 | 2 | 0 | 2 | 3 | 3 |
| 1 | 0 | 1 | 0 | 0 | 1 | E | L | E | L | E | E | L | 1 | 0 | 2 | 0 | 2 | 3 | 1 |
| 1 | 0 | 1 | 0 | 1 | 0 | E | L | E | L | E | L | E | 1 | 0 | 2 | 0 | 2 | 1 | 3 |
| 1 | 0 | 1 | 0 | 1 | 1 | E | L | E | L | E | L | L | 1 | 0 | 2 | 0 | 2 | 1 | 1 |
| 1 | 0 | 1 | 1 | 0 | 0 | E | L | E | L | L | E | E | 1 | 0 | 2 | 0 | 0 | 3 | 3 |
| 1 | 0 | 1 | 1 | 0 | 1 | E | L | E | L | L | E | L | 1 | 0 | 2 | 0 | 0 | 3 | 1 |
| 1 | 0 | 1 | 1 | 1 | 0 | E | L | E | L | L | L | E | 1 | 0 | 2 | 0 | 0 | 1 | 3 |
| 1 | 0 | 1 | 1 | 1 | 1 | E | L | E | L | L | L | L | 1 | 0 | 2 | 0 | 0 | 1 | 1 |
| 1 | 1 | 0 | 0 | 0 | 0 | E | L | L | E | E | E | E | 2 | 1 | 1 | 4 | 4 | 4 | 4 |
| 1 | 1 | 0 | 0 | 0 | 1 | E | L | L | E | E | E | L | 2 | 1 | 1 | 4 | 4 | 4 | 2 |
| 1 | 1 | 0 | 0 | 1 | 0 | E | L | L | E | E | L | E | 2 | 1 | 1 | 4 | 4 | 2 | 4 |
| 1 | 1 | 0 | 0 | 1 | 1 | E | L | L | E | E | L | L | 2 | 1 | 1 | 4 | 4 | 2 | 2 |
| 1 | 1 | 0 | 1 | 0 | 0 | E | L | L | E | L | E | E | 2 | 1 | 1 | 4 | 2 | 4 | 4 |
| 1 | 1 | 0 | 1 | 0 | 1 | E | L | L | E | L | E | L | 2 | 1 | 1 | 4 | 2 | 4 | 2 |
| 1 | 1 | 0 | 1 | 1 | 0 | E | L | L | E | L | L | E | 2 | 1 | 1 | 4 | 2 | 2 | 4 |
| 1 | 1 | 0 | 1 | 1 | 1 | E | L | L | E | L | L | L | 2 | 1 | 1 | 4 | 2 | 2 | 2 |
| 1 | 1 | 1 | 0 | 0 | 0 | E | L | L | L | E | E | E | 2 | 1 | 1 | 2 | 4 | 4 | 4 |
| 1 | 1 | 1 | 0 | 0 | 1 | E | L | L | L | E | E | L | 2 | 1 | 1 | 2 | 4 | 4 | 2 |
| 1 | 1 | 1 | 0 | 1 | 0 | E | L | L | L | E | L | E | 2 | 1 | 1 | 2 | 4 | 2 | 4 |
| 1 | 1 | 1 | 0 | 1 | 1 | E | L | L | L | E | L | L | 2 | 1 | 1 | 2 | 4 | 2 | 2 |
| 1 | 1 | 1 | 1 | 0 | 0 | E | L | L | L | L | E | E | 2 | 1 | 1 | 2 | 2 | 4 | 4 |
| 1 | 1 | 1 | 1 | 0 | 1 | E | L | L | L | L | E | L | 2 | 1 | 1 | 2 | 2 | 4 | 2 |
| 1 | 1 | 1 | 1 | 1 | 0 | E | L | L | L | L | L | E | 2 | 0 | 0 | 1 | 1 | 1 | 1 |
| 1 | 1 | 1 | 1 | 1 | 1 | E | L | L | L | L | L | L | 1 | 1 | 1 | 2 | 2 | 2 | 2 |
| 1 | 1 | 0 | 0 | 0 | 1 | E | L | L | E | E | E | L | 2 | 0 | 0 | 2 | 2 | 2 | 0 |

-continued

| L2N_L? | L2S_L? | C1N_L? | C2N_L? | C1S_L? | C2S_L? | AT_L3 | AT_L2N | AT_L2S | AT_C1N | AT_C2N | AT_C1S | AT_C2S | t_L3 | t_L2N | t_L2S | t_C1N | t_C2N | t_C1S | t_C2S |
|---|---|---|---|---|---|---|---|---|---|---|---|---|---|---|---|---|---|---|---|
| 1 | 1 | 0 | 0 | 1 | 0 | E | L | L | E | E | L | E | 2 | 1 | 1 | 2 | 2 | 0 | 2 |
| 1 | 1 | 0 | 0 | 1 | 1 | E | L | L | E | E | L | L | 2 | 1 | 1 | 2 | 2 | 0 | 0 |
| 1 | 1 | 0 | 1 | 0 | 0 | E | L | L | E | L | E | E | 2 | 1 | 1 | 2 | 0 | 2 | 2 |
| 1 | 1 | 0 | 1 | 0 | 1 | E | L | L | E | L | E | L | 2 | 1 | 1 | 2 | 0 | 2 | 0 |
| 1 | 1 | 0 | 1 | 1 | 0 | E | L | L | E | L | L | E | 2 | 1 | 1 | 2 | 0 | 0 | 2 |
| 1 | 1 | 1 | 0 | 0 | 0 | E | L | L | L | E | E | E | 2 | 1 | 1 | 0 | 2 | 2 | 2 |
| 1 | 1 | 1 | 0 | 0 | 1 | E | L | L | L | E | E | L | 2 | 1 | 1 | 0 | 2 | 2 | 0 |
| 1 | 1 | 1 | 0 | 1 | 0 | E | L | L | L | E | L | E | 2 | 1 | 1 | 0 | 2 | 0 | 2 |
| 1 | 1 | 1 | 1 | 0 | 0 | E | L | L | L | L | E | E | 2 | 1 | 1 | 0 | 0 | 2 | 2 |
| 1 | 1 | 1 | 1 | 0 | 1 | E | L | L | L | L | E | L | 2 | 1 | 1 | 0 | 0 | 2 | 0 |
| 1 | 1 | 1 | 1 | 1 | 1 | E | L | L | L | L | L | L | 2 | 1 | 1 | 0 | 0 | 0 | 0 |

In the table shown above, the columns AT_* refer to the arrival time of the rising (falling) edges at the respective clock domain and the columns t_* define the number of clock cycles by which decreasing the delay value of the programmable delay element associated with the respective clock domain should be deferred to avoid double compression.

Figure 11:
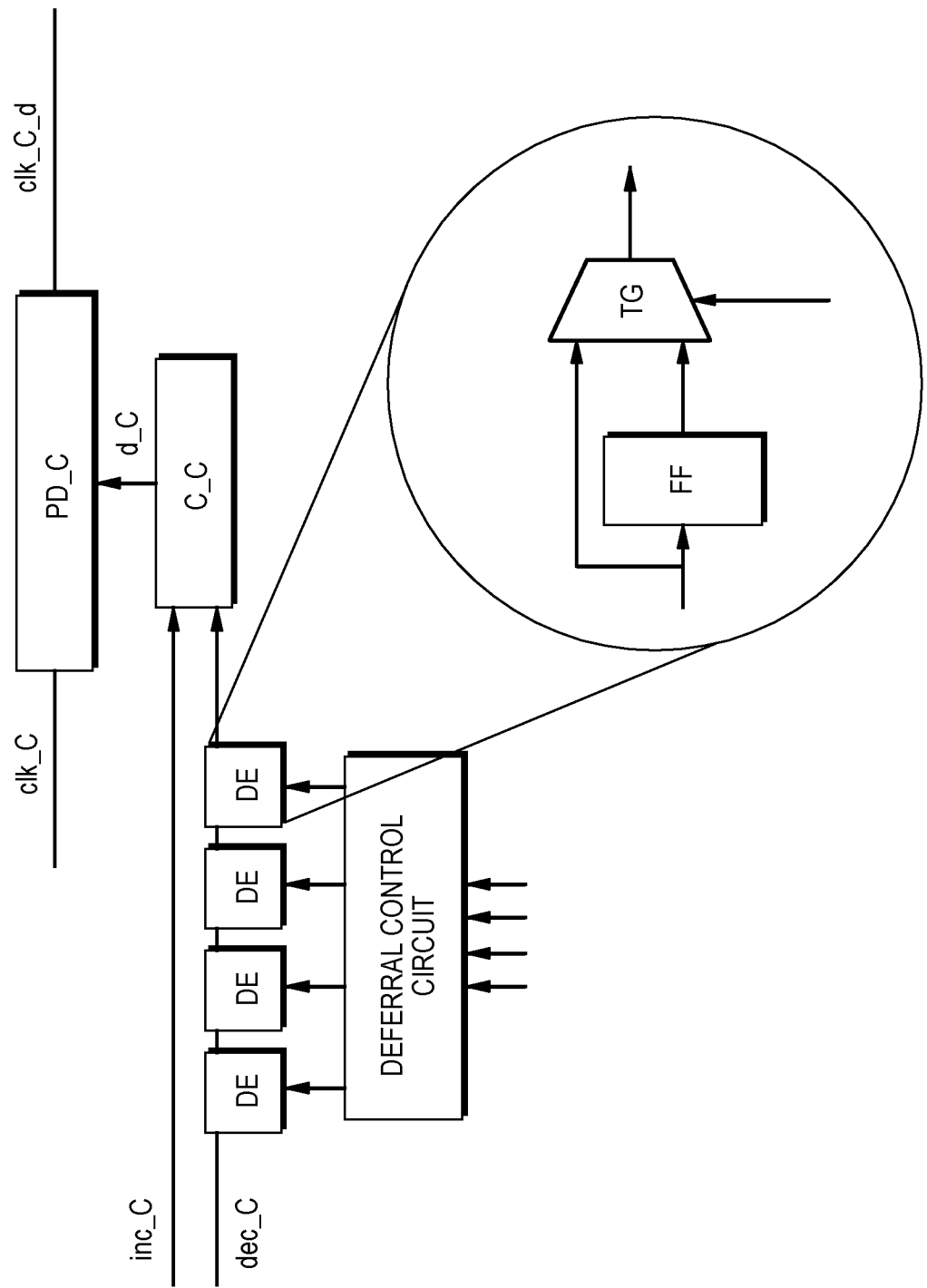
FIG. 11 shows an exemplary programmable delay circuit in accordance with an embodiment of the present invention.

FIG. 11 shows an exemplary circuit implementation for deferring decreasing the delay induced by a programmable delay element. The programmable delay element PD_C receives a clock signal clk_C and transmits a delayed clock signal clk_C_d. The delay d_C is provided by a counter C_C. A known algorithm may provide an increment signal inc_C for incrementing or a decrement signal dec_C for decrementing the value stored in the counter C_C, i.e. the delay d_C to be induced by the programmable delay element PD_C.

Deferral elements DE are provided for deferring decrementing the value stored in the counter C_C by m clock cycles, wherein m has been determined based on the skew between the different clock domains.

The deferral elements may comprise a simple flip-flop for storing the decrement signal dec_c and a transmission gate operated by a deferral control circuit.

What is claimed is:

1. A method for operating a skew control circuit for controlling the de-skewing operation between at least three clock signals, the method comprising:
a skew detector arrangement for detecting skew between at least two pairs of clock signals, and a control circuit for adjusting delays caused by a plurality of programmable delay elements, wherein the control circuit comprises one or more deferral elements and wherein the one or more deferral elements is deferring decrementing value stored in one or more counters by one or more clock cycles;
determining an order of occurrence of edges of the clock signals;
selecting one of the programmable delay elements based on the determined order; and
adjusting the delay caused by the selected plurality of programmable delay elements.

2. The method of claim 1, further comprises repeatedly carrying out the de-skewing operation for different cycles of the clock signals.

3. The method of claim 1, wherein the control circuit comprises at least one counter for holding a control value for controlling the delay caused by a programmable delay element and wherein adjusting the delay comprises incrementing or decrementing the counter.

4. The method of claim 1, further comprises selecting a first programmable delay element associated with a first clock signal corresponding to the last occurring edge.

5. The method of claim 4, wherein the de-skewing operation further comprises deferring adjusting the delay of a second programmable delay element associated with a second clock signal having an earlier occurring edge.

6. The method of claim 5, wherein the de-skewing operation further comprises deferring decreasing the delay of a third programmable delay element.

7. The method of claim 1, wherein determining the order of occurrences of the edges is based on determining the order of occurrences of the edges of pairs of signals.

* * * * *